United States Patent
Dai et al.

(10) Patent No.: US 9,939,313 B2
(45) Date of Patent: Apr. 10, 2018

(54) LOAD CELL WIRELESS KIT

(71) Applicants: METTLER TOLEDO (CHANGZHOU) MEASUREMENT TECHNOLOGY LTD., Changzhou, Jiangsu (CN); METTLER TOLEDO (CHANGZHOU) PRECISION INSTRUMENT LTD., Changzhou, Jiangsu (CN); METTLER TOLEDO (CHANGZHOU) SCALE & SYSTEM LTD., Changzhou, Jiangsu (CN)

(72) Inventors: Feng Dai, Jiangsu (CN); Ming Gao, Jiangsu (CN); Guo Yu Shi, Jiangsu (CN); Hong Wei Liu, Jiangsu (CN)

(73) Assignees: METTLER TOLEDO (CHANGZHOU) MEASUREMENT TECHNOLOGY LTD., Jiangsu (CN); METTLER TOLEDO (CHANGSHOU) PRECISION INSTRUMENT LTD., Jiangsu (CN); METTLER TOLEDO (CHANGZHOU) SCALE & SYSTEM LTD., Jiangsu (CN)

( * ) Notice: Subject to any disclaimer, the term of this patent is extended or adjusted under 35 U.S.C. 154(b) by 350 days.

(21) Appl. No.: 14/695,790

(22) Filed: Apr. 24, 2015

(65) Prior Publication Data

US 2015/0226602 A1    Aug. 13, 2015

Related U.S. Application Data

(63) Continuation of application No. PCT/CN2013/075958, filed on May 21, 2013.

(30) Foreign Application Priority Data

Oct. 25, 2012  (CN) .......................... 2012 1 0414667

(51) Int. Cl.
*H05K 7/14* (2006.01)
*H04L 23/00* (2006.01)
(Continued)

(52) U.S. Cl.
CPC ......... *G01G 23/3728* (2013.01); *G01G 21/28* (2013.01); *H05K 7/1428* (2013.01); *G01D 21/00* (2013.01); *H04L 67/12* (2013.01)

(58) Field of Classification Search
CPC ...... G01D 21/00; H04L 67/12; H05K 7/1428; G01G 21/28; G01G 23/3728
See application file for complete search history.

(56) References Cited

U.S. PATENT DOCUMENTS 5,157,247 A * 10/1992 Takahira ............ G06K 19/0723
235/380
5,361,061 A * 11/1994 Mays ...................... G08B 5/228
340/7.54
(Continued)

FOREIGN PATENT DOCUMENTS

| CN | 201081791 Y | 7/2008 |
|---|---|---|
| CN | 101777227 A | 7/2010 |

(Continued)

OTHER PUBLICATIONS

"12-Volt/USB Travel Mug, Red" image downloaded from the Walmart.com website on Jun. 2, 2017.*
(Continued)

*Primary Examiner* — Randy Gibson
(74) *Attorney, Agent, or Firm* — Buchanan Ingersoll & Rooney PC

(57) ABSTRACT

A load cell wireless kit as disclosed can include a load cell and a kit component removably attached to an outside of the load cell. Exemplary embodiments are free of cables and a junction box, and can provide a great convenience for use
(Continued)

and save power consumption, without affecting normal system functions.

12 Claims, 5 Drawing Sheets

(51) Int. Cl.
*G01G 21/28* (2006.01)
*G01G 23/37* (2006.01)
*H04L 29/08* (2006.01)
*G01D 21/00* (2006.01)

(56) References Cited

U.S. PATENT DOCUMENTS

| | | | | |
|---|---|---|---|---|
| 6,016,432 A * | 1/2000 | Stein | ............ | G11B 31/00 455/556.1 |
| 6,919,516 B2 * | 7/2005 | Frye | ............ | G01G 3/1408 177/132 |
| 8,009,437 B2 * | 8/2011 | Shelton | ............ | G01D 21/00 361/770 |
| 8,212,670 B2 | 7/2012 | Schebel et al. | | |
| 8,346,191 B2 * | 1/2013 | Robinson | ............ | H01M 2/20 429/96 |
| 8,892,034 B2 * | 11/2014 | McGuire | ............ | G01D 21/00 455/73 |
| 9,385,825 B2 * | 7/2016 | Delin | ............ | G01D 21/00 |
| 2004/0026135 A1 | 2/2004 | Huitt et al. | | |
| 2008/0105469 A1 * | 5/2008 | Domel | ............ | G01G 19/44 177/25.12 |
| 2009/0311976 A1 * | 12/2009 | Vanderaa | ............ | G08C 17/04 455/90.3 |
| 2010/0076701 A1 | 3/2010 | Harish | | |
| 2010/0089152 A1 * | 4/2010 | Kolada | ............ | G01F 19/00 73/426 |
| 2010/0102907 A1 | 4/2010 | Schebel et al. | | |
| 2011/0171487 A1 * | 7/2011 | Ruckert | ............ | C22C 47/20 428/615 |
| 2012/0242434 A1 | 9/2012 | Schebel et al. | | |
| 2013/0344818 A1 * | 12/2013 | McGuire | ............ | G01D 21/00 455/73 |

FOREIGN PATENT DOCUMENTS

| | | |
|---|---|---|
| CN | 202057440 U | 11/2011 |
| CN | 202255744 U | 5/2012 |
| CN | 202420645 U | 9/2012 |
| CN | 202453073 U | 9/2012 |
| CN | 102901552 A | 1/2013 |
| CN | 202885952 U | 4/2013 |
| WO | 2009/018115 A2 | 2/2009 |

OTHER PUBLICATIONS

International Search Report (PCT/ISA/210) dated Aug. 22, 2013, by the Chinese Patent Office as the International Searching Authority for International Application No. PCT/CN2013/075958.

Jun Zhu et al., "Design of Wireless Weighing System Based on RF Technology", Process Automation Instrumentation, Feb. 2007, No. 2, vol. 28, pp. 10-12, 15.

The extended European Search Report dated May 4, 2016, by the European Patent Office in corresponding European Patent Application No. 13848504.0-1557. (7 pages).

* cited by examiner

LOAD CELL WIRELESS KIT

RELATED APPLICATION

This application claims priority as a continuation application under 35 U.S.C. § 120 to PCT/CN2013/075958, which was filed as an International Application on May 21, 2013 designating the U.S., and which claims priority to Chinese Application 201210414667.7 filed in China on Oct. 25, 2012. The entire contents of these applications are hereby incorporated by reference in their entireties.

FIELD

The present disclosure relates to a load cell wireless kit, and relates to the field of load cell equipment.

BACKGROUND INFORMATION

With the development of related technology, electronic weighing systems are widely used in various aspects. Known electric weighing systems are composed of a scale body or load bearing structure, a load cell, a junction box and a weighing terminal. The load cell is mounted on the scale body and the load bearing structure, and connected to the junction box via a load cell cable. The junction box in turn is connected to the weighing terminal via a terminal cable. Upon being exposed to external forces, the counter force on the load cell takes a deformation, which simultaneously deformates a resistance strain gauge which is affixed on the load cell, which in turns causes a change in resistance value of the resistance strain gauge. The weighing signal is translated into a corresponding analog electric signal for output through a weighing circuitry.

Alternatively, the analog electric signal can be outputted as a digital electric signal through an analog to digital converter module, the outputted electric signal being fed into the junction box via the load cell cable and then connected to the terminal.

The data is processed and displayed on the terminal to indicate the weight. The load cell cable, the junction box and the terminal cable respectively take responsibility for electric connection between the instruction and each of the load cells, so as to accomplish two tasks: one task is to power the load cells; and the other task is to deliver digital communication signals between the load cells and the terminals. For instance, as to a digital truck scale, the load cell cables to the junction box as well as the cables from the junction box to the terminal could cost several thousand Chinese RMB and also bring a large volume of work to the on-site installation and configuration. During usage, issues such as a broken cable, and junction box flooding could cause system failure and degrade the reliability of the system.

At present, an approach is to equip a wireless communication module onto a counter force on the load cell and connected to the weighing circuitry. Thereafter, the weighing data can be transmitted wirelessly via the wireless communication module, which avoids the cable loss in traditional load cells, reduces the difficulty and workload for construction, and reduces the chance of the load cell being affected from external interference, thereby enlarging the scope of application. However, the application of the load cell is still restricted for the reasons that a wireless communication module is equipped onto the counter force, and the digital load cell involves an external power supply.

SUMMARY

A load cell wireless kit is disclosed, comprising: a load cell; a kit component removably attached to an outside of the load cell, wherein the kit component includes a waterproof shell with a circuitry board and a battery disposed inside the waterproof shell; and an antenna port and an electrical interface for coupling to the load cell and receiving load cell signals mounted on the waterproof shell; wherein the circuitry board is configured with a core processing module, an analog-to-digital converter module, a wired communication module, a wireless communication module and a battery slot; wherein the battery is disposed in the battery slot and is coupled to battery terminals of the core processing module, the analog-to-digital converter module, the wired communication module and the wireless communication module; wherein an input terminal to the analog-to-digital converter module or an input terminal to the wired communication module is coupled to the electrical interface, the waterproof shell is plugged into an interface of the load cell through the electrical interface so as to couple the input terminal to the analog-to-digital converter module or the input terminal to the wired communication module with an analog signal or digital signal outputted from the load cell; and wherein an output of the analog-to-digital converter module is coupled to the core processing module, the wired communication module and the wireless communication module are coupled to a communication port of the core processing module, and the wireless communication module is coupled to an antenna mounted on the antenna port.

A load cell wireless kit is also disclosed, comprising: a load cell; a kit component removably attached to an outside of the load cell, wherein the kit component includes a waterproof shell with a circuitry board disposed inside the waterproof shell; and an antenna port, an electrical interface for coupling to the load cell and receiving load cell signals, and an interface for connecting to an external power supply mounted on the waterproof shell; wherein the circuitry board is configured with a core processing module, an analog-to-digital converter module, a wired communication module, a wireless communication module and a battery slot; wherein an interface of the external power supply is connected to the interface on the waterproof shell and is coupled to battery terminals of the core processing module, the analog-to-digital converter module, the wired communication module and the wireless communication module; wherein an input terminal to the analog-to-digital converter module or an input terminal to the wired communication module is coupled to the electrical interface, the waterproof shell is plugged into an interface of the load cell through the electrical interface so as to couple the input terminal to the analog-to-digital converter module or the input terminal to the wired communication module with an analog signal or digital signal output from the load cell; and wherein an output of the analog-to-digital converter module is coupled to the core processing module, the wired communication module and the wireless communication module are coupled to a communication port of the core processing module, and the wireless communication module is coupled to an antenna mounted on the antenna port.

BRIEF DESCRIPTION OF THE DRAWINGS

Exemplary embodiments will be described in further detail in conjunction with the accompanying drawings, wherein.

Figure 1:
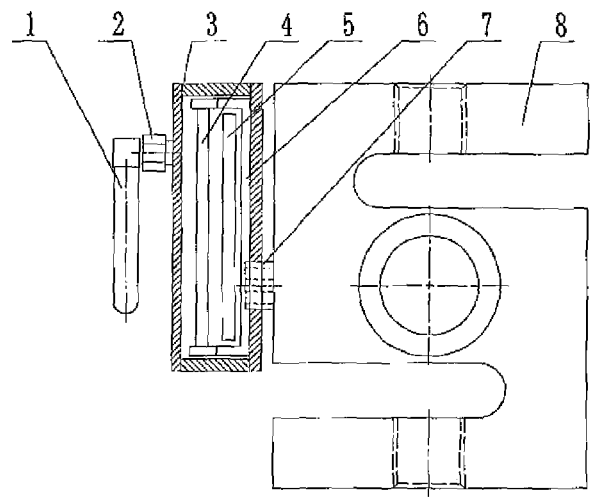
FIG. 1 is a diagram showing structure of an exemplary load cell wireless kit in accordance with the present disclosure.

In the above Figures, like numerals represent like elements; for example, symbol 1 refers to an antenna, 2 refers to an antenna port, 3 refers to a waterproof shell, 4 refers to a circuitry board, 5 refers to a battery, 6 refers to a battery slot, 7 refers to an electrical interface, and 8 refers to a load cell.

DETAILED DESCRIPTION

A load cell wireless kit is disclosed that can be installed free of cables and a junction box, be easy to maintain and repair, and that may reduce power consumption while not affecting normal system functions.

An exemplary technical solution presented by the present disclosure is a load cell wireless kit including a load cell and a kit component removably attached to the outside of the load cell. The kit component having a waterproof shell and a circuitry board as well as a battery disposed inside the waterproof shell. An antenna port as well as an electrical interface for coupling to the load cell and receiving load cell signals is mounted on the waterproof shell. The circuitry board is configured with a core processing module, an analog-to-digital converter module, a wired communication module, a wireless communication module and a battery slot. The battery is disposed in the battery slot and is coupled to the battery terminals of the core processing module, the analog-to-digital converter module, the wired communication module and the wireless communication module. The input terminal to the analog-to-digital converter module or the input terminal to the wired communication module is coupled to the electrical interface. The waterproof shell is plugged into an interface of the load cell through the electrical interface, so as to couple the input terminal to the analog-to-digital converter module or the input terminal to the wired communication module with an analog signal or digital signal outputted from the load cell. The output of the analog-to-digital converter module is coupled to the core processing module. The wired communication module as well as the wireless communication module is coupled to a communication port of the core processing module. The wireless communication module can also be coupled to an antenna mounted on the antenna port.

Another exemplary technical solution presented by the present disclosure is a load cell wireless kit including a load cell and a kit component removably attached to the outside of the load cell. The kit component can include a waterproof shell and a circuitry board disposed inside the waterproof shell. An antenna port, an electrical interface for coupling to the load cell and receiving load cell signals, as well as an interface for connecting to an external power supply are mounted on the waterproof shell. The circuitry board is configured with a core processing module, an analog-to-digital converter module, a wired communication module and a wireless communication module. A connector of the external power supply is coupled into the interface on the waterproof shell and in turn coupled to the battery terminals of the core processing module, the analog-to-digital converter module, the wired communication module and the wireless communication module for providing power thereto. The input terminal to the analog-to-digital converter module or the input terminal to the wired communication module is coupled to the electrical interface. The waterproof shell is plugged into an interface of the load cell through the electrical interface. The input terminal to the analog-to-digital converter module or the input terminal to the wired communication module is coupled with an analog signal or digital signal output from the load cell. The output of the analog-to-digital converter module is coupled to the core processing module. The wired communication module as well as the wireless communication module are coupled to a communication port of the core processing module. The wireless communication module can also be coupled to an antenna mounted on the antenna port.

The above exemplary embodiments can provide the following exemplary technical advantages:

1. The kit component can be coupled to the load cell through the electrical interface mounted on the waterproof shell. This electrical interface is utilized not only for coupling the load cell, but also for receiving the signals outputted from the load cell. The electrical interface can be coupled to the input terminal of the analog-to-digital converter module or to the input terminal of the wired communication module, and thereby can be specified as desired in accordance with the type of the load cell for facilitating the signal communication between the kit component with the analog signals or digital signals output from the load cell. The antenna mounted on the waterproof shell can perform the signal communication with the core processing module through the wireless communication module. Therefore, both the wired communication and the wireless communication can be implemented and a great convenience in usage can be presented.

2. The kit component can be protected by a waterproof shell. The waterproof shell is coupled to the load cell through the electrical interface, which is easy to be mounted/unmounted, therefore facilitating repair and replacement. Being implemented without any junction box or input/output cables, the installation can be performed free of cables and junction boxes, while facilitating the communication between the load cell and the weighing terminal through the kit component, thereby reducing power consumption during the operation, increasing the system reliability and decreasing the usage cost, also providing a good interchangeability.

3. The circuitry board can be installed inside the waterproof shell, with the core processing module, the analog-todigital converter module, the wired communication module and the wireless communication module configured on the circuitry board. The analog signals received from the load cell can be translated to digital signals through the analog-to-digital converter module and provided to the core processing module. The wired communication module can be responsible for receiving digital signals from the load cell and performing protocol interaction with the load cell and also providing the same to the core processing module. The core processing module in turn receives and processes the digital signals from the analog-to-digital converter module, and completes the translation between the wired communication protocol and the wireless communication protocol. The wireless communication module transmits the weighing signals of the core processing module or the wired communication protocol to the weighing terminal in wireless signals, translates instructions from the weighing terminal into acceptable communication protocol and delivers the same to the core processing module. As such, exemplary embodiments can provide a variety of communication modes and can be suitable for load cells with different output signals.

4. The wireless signals from the wireless communication module can be transmitted from the antenna mounted on the waterproof shell. Therefore, different types of antennas can be adopted based on the structure of load cells.

5. Exemplary embodiments can power the modules and the load cell by a battery mounted on the circuitry board, and also by an external power supply. For example, the electrical interface may act as the power charging interface. In this manner, when the kit component is removed from the load cell, the electrical interface on the kit component may work as the power charging interface for the battery. A dedicated power charger can be used to charge the battery through the electrical interface.

Exemplary embodiments are illustrated further in the drawings, where as shown in FIGS. 1-9, an exemplary load cell wireless kit as disclosed herein includes a load cell 8 and a kit component removably attached to the outside of the load cell 8. The kit component can include a waterproof shell 3 and a circuitry board 4 as well as a battery 5 disposed inside the waterproof shell 3. The waterproof shell 3 is constructed by a sealed connection of two detachable shells. An antenna port 2 as well as an electrical interface 7 for coupling to the load cell 8 and receiving load cell 8 signals is mounted on the waterproof shell 3.

Figure 10:
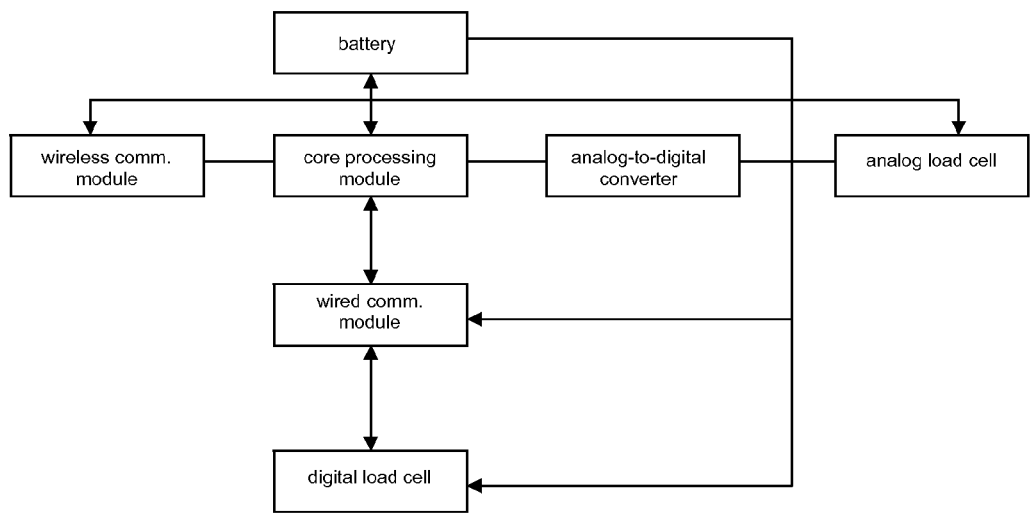
FIG. 10 is a diagram showing a principle of an exemplary load cell wireless kit in accordance with the present disclosure.

As shown in FIG. 10, the circuitry board 4 is configured with a core processing module, an analog-to-digital converter module, a wired communication module, a wireless communication module and a battery slot 6. The battery 5 is disposed in the battery slot 6 and is coupled to the battery terminals of the core processing module, the analog-to-digital converter module, the wired communication module and the wireless communication module. The battery 5 powers the modules as well as the weighing circuitry in the load cell 8. The battery 5 can be a chargeable battery or a disposable battery.

The electrical interface 7 is coupled to the battery slot 6. When the chargeable battery is in low power, a power charger can be coupled through the electrical interface 7 and charges the chargeable battery. Upon the battery being a disposable battery, the battery can be replaced when it is in low power. The analog signals or digital signals outputted from the load cell are received by the electrical interface 7 on the waterproof shell 3.

The waterproof shell 3 can be attached to one side of the load cell 8 through the electrical interface 7 or enfolds the load cell 8. As shown in FIG. 1, the waterproof shell can be in a rectangle-shaped structure, and disposed on one side of a tension load cell through the electrical interface 7.

Figure 2:
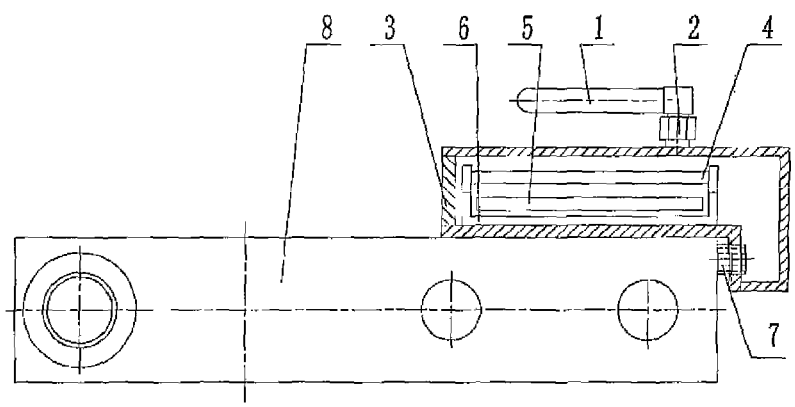
FIG. 2 is a diagram showing structure of an exemplary load cell wireless kit in accordance with the present disclosure.
Figure 3:
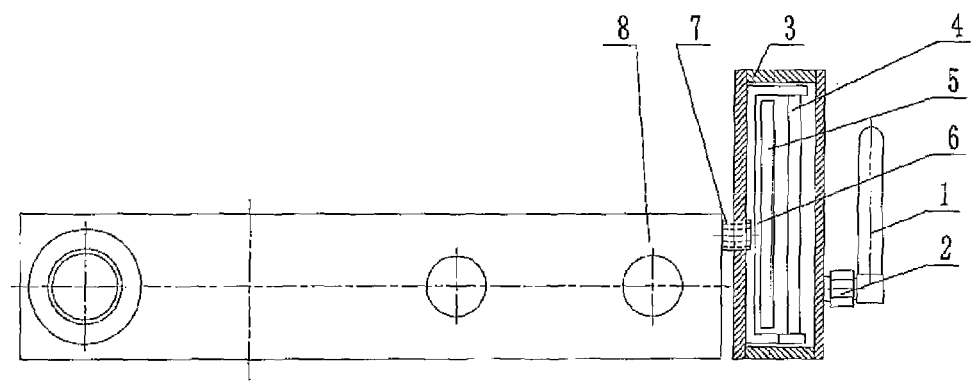
FIG. 3 is a diagram showing structure of an exemplary load cell wireless kit in accordance with the present disclosure.

Alternatively, as shown in FIGS. 2 and 3, the waterproof shell 3 can be a corner-shaped structure or rectangle-shaped structure, and disposed on one side of a shear beam load cell or a bending beam load cell through the electrical interface 7.

Figure 4:
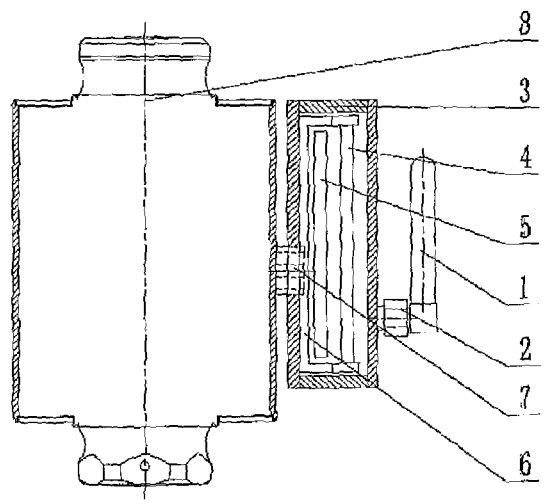
FIG. 4 is a diagram showing structure of an exemplary load cell wireless kit in accordance with the present disclosure.
Figure 5:
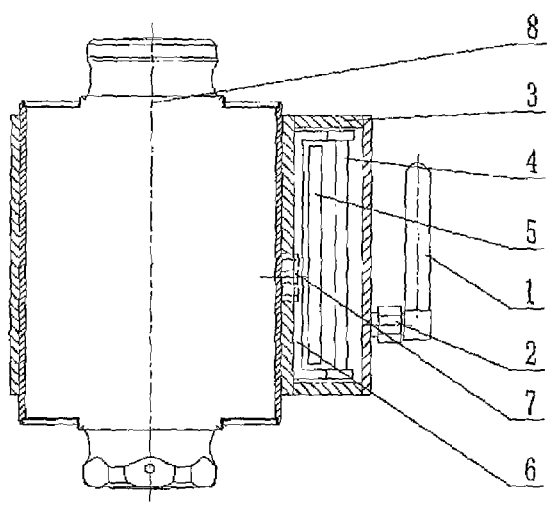
FIG. 5 is a diagram showing structure of an exemplary load cell wireless kit in accordance with the present disclosure.
Figure 6:
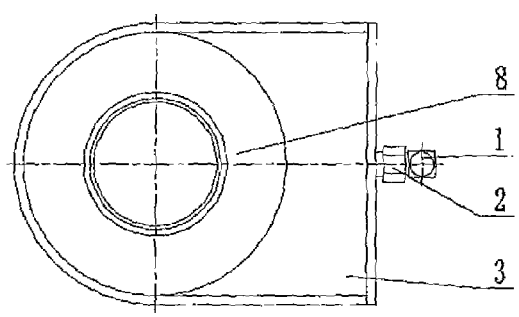
FIG. 6 is a top view for FIG. 5.

As shown in FIG. 4, the waterproof shell 3 can be a rectangle-shaped structure, and disposed on one side of a column load cell through the electrical interface 7. Or, as shown in FIGS. 5 and 6, the waterproof shell 3 can be a box-shaped structure with a cambered side fitting the outer surface of a column load cell and disposed on one side of the column load cell through the electrical interface 7.

Figure 7:
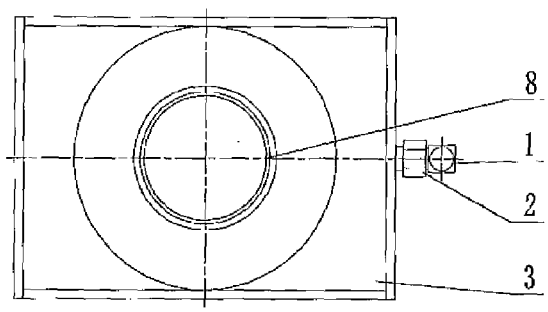
FIG. 7 is a diagram showing structure of an exemplary load cell wireless kit in accordance with the present disclosure.
Figure 8:
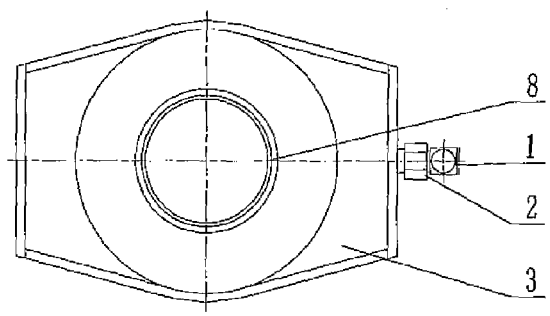
FIG. 8 is a diagram showing structure of an exemplary load cell wireless kit in accordance with the present disclosure.
Figure 9:
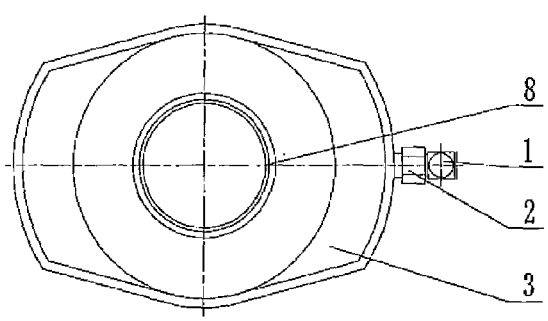
FIG. 9 is a diagram showing structure of an exemplary load cell wireless kit in accordance with the present disclosure.

Still alternatively, as shown in FIGS. 7 to 9, the waterproof shell 3 can be in a rectangle-shaped structure or a prismatic structure or a waist round structure, and disposed on the column load cell through the electrical interface 7. The waterproof shell 3 enfolds the column load cell.

As shown in the exemplary embodiment of FIG. 10, the input terminal to the analog-to-digital converter module or the input terminal to the wired communication module can be coupled to the electrical interface 7. The waterproof shell 3 is plugged into an interface of the load cell 8 through the electrical interface 7, so as to couple the input terminal to the analog-to-digital converter module or the input terminal to the wired communication module with an analog signal or digital signal outputted from the load cell 8. The output of the analog-to-digital converter module is coupled to the core processing module. The wired communication module as well as the wireless communication module is coupled to a communication port of the core processing module. The wireless communication module is further coupled to an antenna 1 mounted on the antenna port 2.

The core processing module can, for example, be an MCS13192 chip which is integrated with a HCS08 8-bit CPU. The core processing module is responsible for receiving and processing the digital signals from the analog-to-digital converter module, and also for translating between the wired communication protocols and the wireless communication protocols. The analog-to-digital converter module is responsible for receiving the analog signals from the load cell and converting the analog signals digital signals. The wired communication module is responsible for receiving the digital signals from the load cell and exchanging protocols with the load cell. The wireless communication module is responsible for converting the weighing signal or the wired communication protocols that have been processed by the core processing module into wireless signals and sending the same to a weighing terminal, and for translating the instructions from the weighing terminal into an acceptable communication protocol and delivering the same to the core processing module.

The wireless communication module in accordance with exemplary embodiments can be a wireless communication module based on any wireless communication protocol including for example WiFi, Zigbee, Wireless USB or RFID. The wired communication module in accordance with exemplary embodiments of the present disclosure can be a wired communication module based on any wired communication protocol including for example CAN, RS485, RS232, USB or Ethernet.

A load cell wireless kit in accordance with exemplary embodiments of the present disclosure can include a load cell 8 and a kit component removable attached to the outside of the load cell 8. The kit component can include a waterproof shell 3 and a circuitry board 4 disposed inside the waterproof shell. An antenna port 2, an electrical interface 7 for coupling to the load cell 8 and receiving load cell 8 signals, as well as an interface for connecting to an external power supply are mounted on the waterproof shell 3.

Figure 11:
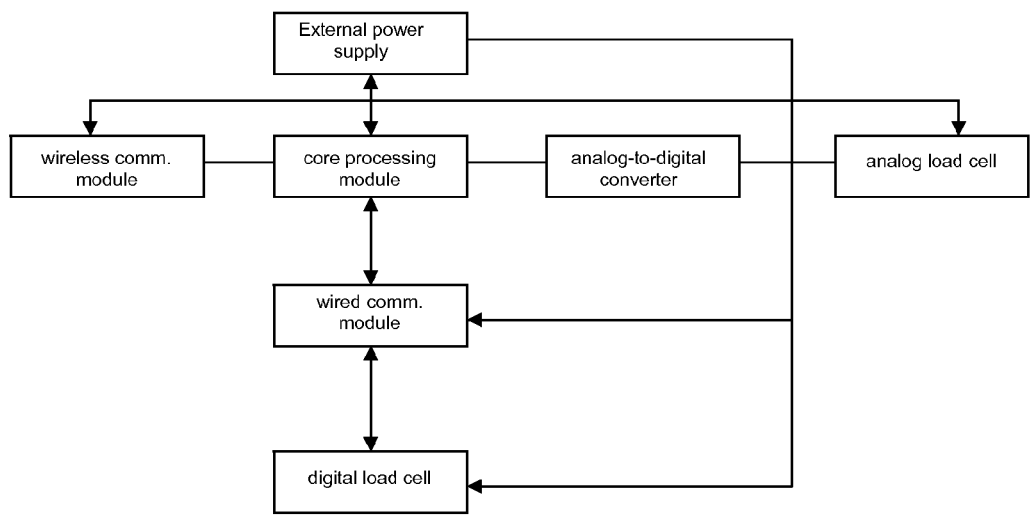
FIG. 11 is a diagram showing a principle of an exemplary load cell wireless kit in accordance with the present disclosure.

What is different from the previously discussed embodiments is that no battery is disposed inside the waterproof shell 3 and an external power supply is utilized to power the operational modules. As shown in FIG. 11, the circuitry board 4 can be configured with a core processing module, an analog-to-digital converter module, a wired communication module and a wireless communication module. A connector of the external power supply is coupled into the interface on the waterproof shell 3 and in turn coupled to the battery terminals of the core processing module, the analog-to-digital converter module, the wired communication module and the wireless communication module for providing power thereto. The input terminal to the analog-to-digital converter module or the input terminal to the wired communication module is coupled to the electrical interface 7.

The waterproof shell 3 is plugged into an interface of the load cell 8 through the electrical interface 7. The input terminal to the analog-to-digital converter module or the input terminal to the wired communication module is coupled with an analog signal or digital signal output from the load cell 8. The output of the analog-to-digital converter module is coupled to the core processing module. The wired communication module as well as the wireless communication module is coupled to a communication port of the core processing module. The wireless communication module is further coupled to an antenna 1 mounted on the antenna port 2.

Similarly, the wireless communication module can be a wireless communication module based on any wireless communication protocol including for example WiFi, Zigbee, Wireless USB or RFID. The wired communication module can be a wired communication module based on any wired communication protocol including for example CAN, RS485, RS232, USB or Ethernet.

The core processing module in accordance is responsible for receiving and processing the digital signals from the analog-to-digital converter module, and also for translating between the wired communication protocols and the wireless communication protocols. The analog-to-digital converter module is responsible for receiving the analog signals from the load cell and converting the analog signals digital signals. The wired communication module is responsible for receiving the digital signals from the load cell and exchanging protocols with the load cell. The wireless communication module is responsible for converting the weighing signal or the wired communication protocols that have been processed by the core processing module into wireless signals and sending the same to a weighing terminal, and for translating the instructions from the weighing terminal into an acceptable communication protocol and delivering the same to the core processing module.

During the operation of exemplary embodiments as discussed herein, a wireless receiving device is installed on the main control device, such as the weighing terminal or a computer, for exchanging weights and commands with a plurality of load cells 8, thereby facilitating the wireless management for load cells 8.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. A wireless kit for a load cell, comprising:
   a kit component including a waterproof shell with a circuitry board disposed inside the waterproof shell; and
   an antenna port and an electrical interface for coupling to the load cell and receiving load cell signals mounted on the waterproof shell;
   wherein the circuitry board is configured with a core processing module, an analog-to-digital converter module, a wired communication module, a wireless communication module and a battery slot;
   wherein a battery is disposed in the battery slot inside the waterproof shell and is coupled to battery terminals of the core processing module, the analog-to-digital converter module, the wired communication module and the wireless communication module;
   wherein an input terminal of the analog-to-digital converter module or an input terminal of the wired communication module is coupled to the electrical interface;
   wherein the waterproof shell is configured to be removably plugged through the electrical interface into an interface of the load cell so as to couple the input terminal to the analog-to-digital converter module or the input terminal to the wired communication module with an analog signal or digital signal outputted from the load cell; and
   wherein an output of the analog-to-digital converter module is coupled to the core processing module, the wired communication module and the wireless communication module are coupled to a communication port of the core processing module, and the wireless communication module is coupled to an antenna mounted on the antenna port.

2. A wireless kit, comprising:
   a kit component including a waterproof shell with a circuitry board disposed inside the waterproof shell; and
   an antenna port, an electrical interface for coupling to the load cell and receiving load cell signals, and an interface for connecting to an external power supply mounted on the waterproof shell;
   wherein the circuitry board is configured with a core processing module, an analog-to-digital converter module, a wired communication module, a wireless communication module and a battery slot;
   wherein an interface of the external power supply is connected to the interface on the waterproof shell and is coupled to battery terminals of the core processing module, the analog-to-digital converter module, the wired communication module and the wireless communication module;
   wherein an input terminal of the analog-to-digital converter module or an input terminal of the wired communication module is coupled to the electrical interface;
   wherein the waterproof shell is configured to be removably plugged through the electrical interface into an interface of the load cell so as to couple the input terminal to the analog-to-digital converter module or the input terminal to the wired communication module with an analog signal or digital signal output from the load cell; and wherein an output of the analog-to-digital converter module is coupled to the core processing module, the wired communication module and the wireless communication module are coupled to a communication port of the core processing module, and the wireless communication module is coupled to an antenna mounted on the antenna port.

3. The wireless kit of claim 1, wherein the wireless communication module is selected from the group consisting of WiFi, Zigbee, Wireless USB or RFID.

4. The wireless kit of claim 1, wherein the wired communication module is selected from the group consisting of CAN, RS485, RS232, USB or Ethernet.

5. The wireless kit of claim 1, wherein the waterproof shell is attached to one side of the load cell through the electrical interface or enfolds the load cell.

6. The wireless kit of claim 1, wherein the battery is a chargeable battery or a disposable battery, and the electrical interface is coupled to the battery slot.

7. The wireless kit of claim 2, wherein the wireless communication module is selected from the group consisting of WiFi, Zigbee, Wireless USB or RFID.

8. The wireless kit of claim 2, wherein the wired communication module is selected from the group consisting of CAN, RS485, RS232, USB or Ethernet.

9. The wireless kit of claim 2, wherein the waterproof shell is attached to one side of the load cell through the electrical interface or enfolds the load cell.

10. The wireless kit of claim 2, wherein the battery is a chargeable battery or a disposable battery, and the electrical interface is coupled to the battery slot.

11. A load cell assembly, comprising:
a load cell; and
a wireless kit of claim 1, which is configured to be removably plugged through the electrical interface into the interface of the load cell.

12. A load cell assembly, comprising:
a load cell; and
a wireless kit of claim 2, which is configured to be removably plugged through the electrical interface into the interface of the load cell.

* * * * *

UNITED STATES PATENT AND TRADEMARK OFFICE
CERTIFICATE OF CORRECTION

PATENT NO. : 9,939,313 B2  
APPLICATION NO. : 14/695790  
DATED : April 10, 2018  
INVENTOR(S) : Feng Dai et al.

Page 1 of 1

It is certified that error appears in the above-identified patent and that said Letters Patent is hereby corrected as shown below:

On the Title Page

Item (73), "METTLER TOLEDO (CHANGSHOU) PRECISION INSTRUMENT LTD., Jiangsu (CN)" should read -- METTLER TOLEDO (CHANGZHOU) PRECISION INSTRUMENT LTD., Jiangsu (CN) --.

Signed and Sealed this  
Tenth Day of July, 2018

Andrei Iancu  
*Director of the United States Patent and Trademark Office*